United States Patent
Roohparvar

(10) Patent No.: US 6,578,124 B1
(45) Date of Patent: *Jun. 10, 2003

(54) SERIAL COMMAND PORT METHOD, CIRCUIT, AND SYSTEM INCLUDING MAIN AND COMMAND CLOCK GENERATORS TO FILTER SIGNALS OF LESS THAN A PREDETERMINED DURATION

(75) Inventor: Frankie Fariborz Roohparvar, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/908,242

(22) Filed: Aug. 7, 1997

Related U.S. Application Data

(63) Continuation of application No. 08/386,688, filed on Feb. 10, 1995, now Pat. No. 5,682,496.

(51) Int. Cl.⁷ ..................... G06F 13/00; G11C 11/4193

(52) U.S. Cl. ................. 711/167; 711/103; 365/233

(58) Field of Search ........................ 711/103, 167; 713/400, 401, 500, 503; 365/233, 193, 194

(56) References Cited

U.S. PATENT DOCUMENTS

| | | | |
|---|---|---|---|
| 4,223,394 A | 9/1980 | Pathak et al. | 365/210 |
| 4,606,052 A | 8/1986 | Hirzel et al. | 375/333 |
| 4,654,831 A | 3/1987 | Venkatesh | 365/207 |
| 5,053,990 A | 10/1991 | Kreifels et al. | 711/103 |

(List continued on next page.)

FOREIGN PATENT DOCUMENTS

| | | |
|---|---|---|
| DE | 4241327 | 6/1993 |
| EP | 0377841 | 7/1990 |
| EP | 0554053 | 8/1992 |
| FR | 2611301 | 8/1988 |
| GB | 2215156 | 9/1989 |
| JP | 57-163878 | 10/1982 |
| JP | 60-224197 | 11/1985 |
| JP | 62-22079 | 1/1987 |
| JP | 63-313397 | 12/1988 |
| JP | 64-88645 | 4/1989 |

(List continued on next page.)

OTHER PUBLICATIONS

Kynett, V.N., ""An In–System Reprogrammable 32Kx8 CMOS Flash Memory"", *IEEE Journal of Solid–State Circuits*, 23(5), (Oct. 1988).

(List continued on next page.)

*Primary Examiner*—Glenn Gossage
(74) *Attorney, Agent, or Firm*—Schwegman, Lundberg, Woessner & Kluth, P.A.

(57) ABSTRACT

A serial command port for a flash memory device, such as an erasable programmable read-only memory (EPROM) or an electrically erasable programmable read-only memory (EEPROM), is disclosed. A main clock generator circuit is used to filter external signals. The main clock generator circuit generates a main clock signal when the external signals have been asserted for a predetermined amount of time. The command port receives commands via a data bus, and a command clock generator generates a command clock signal in response to the main clock signal to latch commands from the data bus into a command register. The command register is coupled to send each command to a command decode logic circuit to be decoded. A state clock generator generates a state clock signal following the main clock signal such that a state latch and logic circuit coupled to the command decode logic circuit changes state in response to the decoded command. Control circuitry is coupled to the state latch and logic circuit to generate signals to effect the change of state.

39 Claims, 4 Drawing Sheets

U.S. PATENT DOCUMENTS

| | | | | |
|---|---|---|---|---|
| 5,077,738 | A | 12/1991 | Larsen et al. | 714/42 |
| 5,163,023 | A | 11/1992 | Ferris et al. | 365/200 |
| 5,177,745 | A | 1/1993 | Rozman | 714/718 |
| 5,222,046 | A | 6/1993 | Kreifels et al. | 335/230.06 |
| 5,222,076 | A | 6/1993 | Ng et al. | 375/9 |
| 5,241,505 | A | 8/1993 | Hashimoto | 365/210 |
| 5,253,210 | A | 10/1993 | Terada | 365/207 |
| 5,262,984 | A | 11/1993 | Noguchi et al. | 365/185 |
| 5,265,054 | A | 11/1993 | McClure | 365/200 |
| 5,293,088 | A | 3/1994 | Kasa | 327/51 |
| 5,306,963 | A | 4/1994 | Leak | 327/14 |
| 5,307,317 | A | 4/1994 | Shiraishi et al. | 365/205 |
| 5,343,439 | A | 8/1994 | Hoshino | 365/240 |
| 5,414,829 | A | 5/1995 | Fandrich et al. | 711/101 |
| 5,430,859 | A * | 7/1995 | Norman et al. | 711/103 |
| 5,463,757 | A * | 10/1995 | Fandrich | 711/103 |
| 5,500,810 | A | 3/1996 | Shou et al. | 708/300 |
| 5,504,441 | A | 4/1996 | Sigal | 326/93 |
| 5,509,134 | A | 4/1996 | Fandrich et al. | 711/103 |
| 5,513,333 | A | 4/1996 | Kynett et al. | 711/103 |
| 5,519,652 | A | 5/1996 | Kumakura et al. | 365/185 |
| 5,530,673 | A | 6/1996 | Tobita et al. | 365/185 |
| 5,530,828 | A * | 6/1996 | Kaki et al. | 711/103 |
| 5,682,496 | A * | 10/1997 | Roohparvar | 711/103 |

FOREIGN PATENT DOCUMENTS

| | | |
|---|---|---|
| JP | 1212018 | 8/1989 |
| JP | 01-245499 | 9/1989 |
| JP | 2-3834 | 1/1990 |
| JP | 2-214945 | 8/1990 |
| JP | 02-236471 | 9/1990 |
| JP | 02-301100 | 12/1990 |
| JP | 03-38730 | 2/1991 |
| JP | 3-263696 | 11/1991 |
| JP | 4-147496 | 5/1992 |
| JP | 5048410 | 2/1993 |
| JP | 05-334201 | 12/1993 |
| JP | 6-222948 | 8/1994 |
| JP | 06-314952 | 11/1994 |

OTHER PUBLICATIONS

Shiraishi, M., et al., "User Programmable 16BIT 50ns DSP", *IEEE Custom Integrated Circuits Conference*, pp. 6.4.1–6.4.4, (May 1992).

Office Action for Japanese Patent Application No. 08–524411 filed Feb. 8, 1996, (2001), 4 pages.

Office Action for Japanese Patent Application No. 08–524417 filed Feb. 8, 1996, (2001), 3 pages.

* cited by examiner

SERIAL COMMAND PORT METHOD, CIRCUIT, AND SYSTEM INCLUDING MAIN AND COMMAND CLOCK GENERATORS TO FILTER SIGNALS OF LESS THAN A PREDETERMINED DURATION

This application is a continuation of U.S. patent application Ser. No. 08/386,688, filed Feb. 10, 1995, now U.S. Pat. No. 5,682,496.

FIELD OF THE INVENTION

The present invention generally relates to the field of electrically programmable and electrically erasable read-only memory, and more particularly to a filtered serial-event-controlled command port for a flash memory device.

BACKGROUND OF THE INVENTION

The power and flexibility of personal computers have increased dramatically since their introduction in the marketplace. As a result, the use of computers has risen significantly and has had a tremendous impact in society. In essence, personal computers typically comprise a microprocessor chip, random access memory, and non-volatile memory. Non-volatile memory is memory that retains its previously stored information even when power is no longer supplied to the chip. One type of non-volatile memory is read-only flash memory, which can be erased electrically rather than by exposure to ultra-violet light. Read-only flash memories are also electrically programmable.

A variety of conceived memory-command interfaces has simplified reading and writing information to non-volatile memories coupled to microprocessors. With such an interface, a microprocessor can issue a command such as "erase" or "program" through data lines connecting the microprocessor to the memory chip. The chip typically contains logic circuitry for decoding and executing these commands.

The prior art employs different methods for implementing this logic circuitry. FIG. 1 depicts an example of one implementation, disclosed in U.S. Pat. No. 5,222,046. To request the execution of a command, the control lines of the microprocessor externally generates an asynchronous clock signal by bringing chip enable and write enable lines $\overline{CE}$ and $\overline{WE}$ low. Typically, a clock signal lasts approximately 50 nanoseconds (ns), and the time between successive clock signals is even shorter, approaching 10 nanoseconds (ns).

Such a short duration, however, can potentially disrupt the logic circuitry of a memory device from properly executing a desired command. Typically, data latches into the command and state registers incident to the externally generated asynchronous clock signal. The state decoder block then decodes the output of the registers and directs execution of the proper command. However, the parasitic capacitance associated with the chip typically delays movement of data through the data bus to the registers. Before the data reaches the registers, the microprocessor may generate another clock signal asking for a second command to be performed on different data. Potentially, this may confuse the decoder block, causing it to direct execution of the second command on the wrong data, and to fail to execute the first command.

For example, the microprocessor may request execution of a first command on a first data. The state decoder block will receive this command, and begin waiting for the first data to move through the data bus to the state and command registers. Before the data reaches the registers, however, the microprocessor may request execution of a second command on a second data. The decoder block may receive this second command before the first data has reached the registers. When the first data does arrive, the block will direct execution of the second command on the first data, thus directing performance of the wrong command on the first data. Therefore, a drawback to the approach employed by the prior art is that extreme care must be taken in designing a non-volatile memory device chip so as to prevent this problem from occurring.

It should be noted, however, that typically once a command is received by the command architecture, it latches therein such that subsequent data received by the architecture will have the last received command performed upon it. For example, in the sequence COMMAND-DATA1-DATA2, both DATA1 and DATA2 will have COMMAND performed upon them. In other words, each sent data does not require a separately command—the command COMMAND-DATA1-COMMAND-DATA2 is not necessary, for example, to perform COMMAND on both DATA1 and DATA2. Furthermore, where the command architecture has initially powered up and no command has yet been sent to it, typically the default command in such an instance is a read command.

This parallel approach to command architecture also poses a problem because of the simultaneous nature of the command and state processing inherent in a parallel approach. The state register must read and process data off the bus concurrent to the command register reading and processing a command off the bus. The registers must output to the state decoder block the results of their processing nearly simultaneously, or the state decoder will not direct execution of the command upon the data correctly. In using a non-volatile memory employing the prior art approach to command architecture, a designer must take proper precaution to avoid this situation from occurring.

In addition, the approach taken by the prior art is highly sensitive to noise on the $\overline{WE}$ and $\overline{CE}$ lines. The internal logic circuitry of a non-volatile memory device may potentially perceive even a brief burst of simultaneous noise on the $\overline{WE}$ and $\overline{CE}$ lines as an asynchronous clock signal generated externally by the microprocessor. This would erroneously cause the state and command registers to latch, and the state decoder block to decode. The decoder block would then direct execution of a command upon data in the device that the microprocessor had not actually requested. Therefore, a drawback to the approach employed by the prior art is that it is vulnerable to noise on the $\overline{CE}$ and $\overline{WE}$ lines inciting erroneous commands to be executed upon data in the memory device.

This problem is exasperated in many systems where the $\overline{CE}$ line is typically tied low. Noise on the $\overline{WE}$ line is then sufficient to incite erroneous execution of a command. A command architecture might divide execution of an erase command into two parts: an erase-setup command for directing the command to occur, and an erase-confirm command for verifying that the command has executed. Even if the erase-setup command executes properly, noise on the $\overline{WE}$ line before the command register has received the erase-confirm command will frustrate proper execution of the operation. This is because after handling the erase-setup command, the state register expects to receive an erase-confirm command. When it does not, it signals an error, even if the next command on the bus is an erase-confirm command. A prior-art memory device operating in such a noisy environment may thus encounter curtailed performance.

SUMMARY OF THE INVENTION

The present invention is directed to a circuit to filter any signals asserted on lines $\overline{WE}$ and $\overline{CE}$ less than a predetermined duration, and to execute processing of a command and state within the command architecture in a serial manner. The circuit of the invention eliminates the potential for the state block decoder to direct execution of a wrong command because the duration is necessarily longer than the delay in data moving through the data bus to the register. The circuit of the invention also eliminates the potential for erroneous execution because a single register handles both data and command information off the bus, processing it in a serial manner. Further, the circuit of the invention eliminates vulnerability to noise that may cause the decoder to direct execution of an erroneous command, because typically such noise is shorter in duration than that which the invention allows to pass.

These and other advantages and features that characterize the present invention are described with particularity in the claims appended hereto and forming a further part hereto. For better understanding of the invention, its advantages and objectives, reference should be made to the drawings, which form a further part hereto, and to the accompanying descriptive matter, which illustrates and describes a preferred embodiment of the present invention.

DETAILED DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention. For instance, the present invention has application in connection with non-volatile erasable programmable read-only memory (EPROM) and electrically erasable programmable read-only memory (EEPROM) chips. In addition, the circuits for filtering incoming commands from an external microprocessor may be implemented using various forms of active or passive circuits, and the respective circuits providing the input and output signals to the state decoder may be implemented in a number of modified forms. The preferred circuits depicted in FIG. 2 show an exemplary arrangement in accordance with the present invention, but it should be recognized that other circuits may be implemented within the scope of the present invention without loss of generality.

Figure 2:
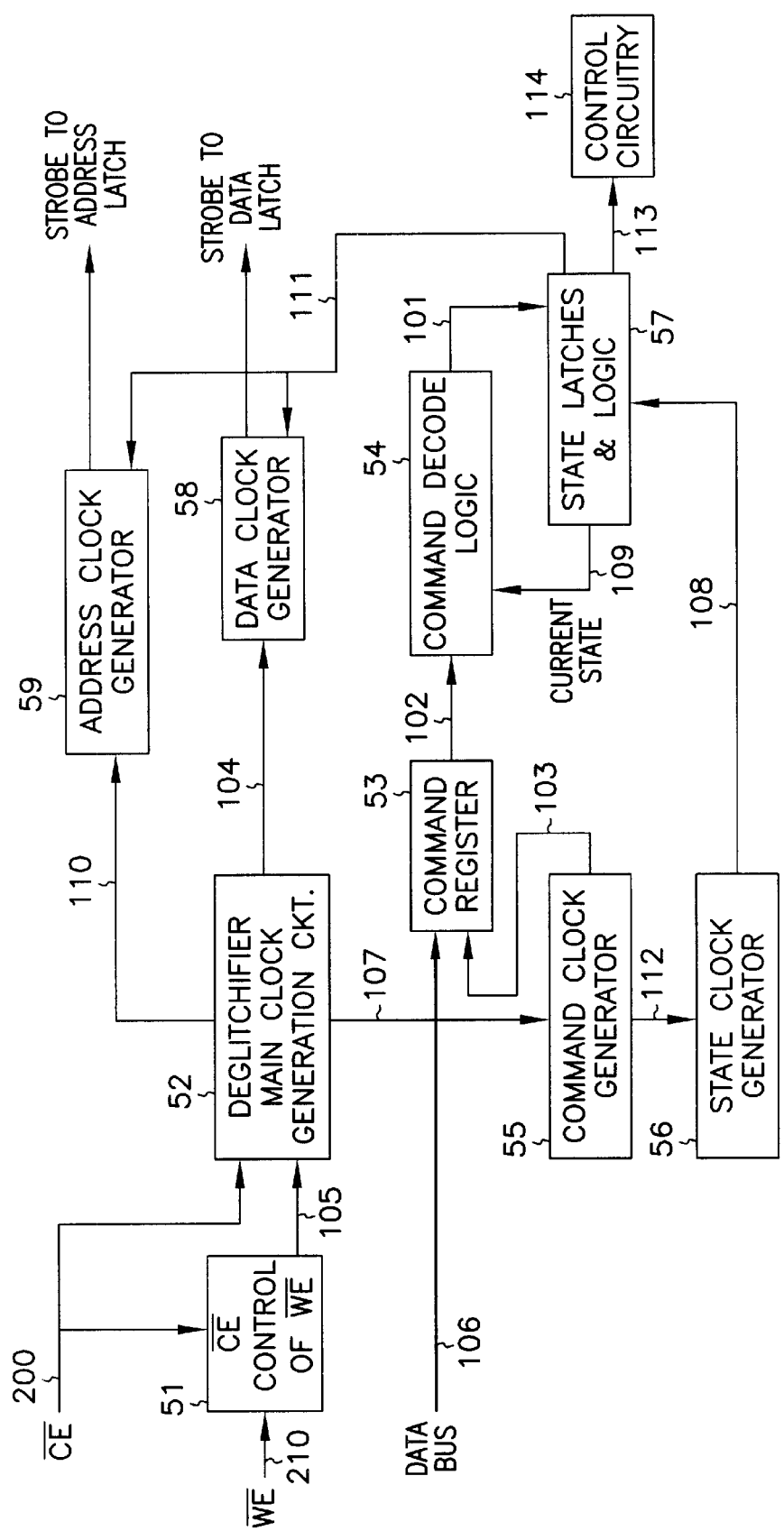
FIG. 2 is a block diagram of a filtered command port architecture according to an embodiment of the present invention.

FIG. 2 is a block diagram of a filtered command port architecture according to an embodiment of the present invention. External signal lines WE and CE 210 and 200 are coupled to a block 51. When WE and CE line signals 210 and 200 are low, a signal on a line 105 is asserted signifying the existence of legal conditions for a command or data load instruction. The signal on the line 105 is then coupled to a main clock generator circuit 52. The main clock generator circuit 52 may also be called a de-glitchifier and main clock generation circuit 52. If the duration of signal 105 is less than a predetermined filter duration, the signal is prevented The invention takes a new and novel approach to interpreting the command cycling commonly used by non-volatile memory devices. A typical specification for a non-volatile memory device stipulates the assertion of a command for 50 nanoseconds (ns), followed by a period of "dead" time lasting 10 ns. Whereas the prior art incites simultaneous latching of the state and command registers immediately upon the beginning of a new cycle, the invention first delays any latching by 20 ns while the main clock generation circuit 52 ensures that the assertion of the WE and CE lines 210 and 200 is not due to noise. In the remaining 30 ns of the cycle, a command register 53 first reads the command off the data bus and processes it. The same register then reads the data off the bus and processes it. Therefore, the present invention effectively reapportions the typical 60 ns clock cycle consisting of 50 ns command-assertion time and 10 ns "dead" time into a command-assertion time of 30 ns and "dead" time of 30 ns. The 20 ns increase in "dead" time results from the delay imposed by the filtering effect of clock generator circuit 52 from continuing, and none of the outputs of main clock generator circuit 52 are asserted.

Figure 3:
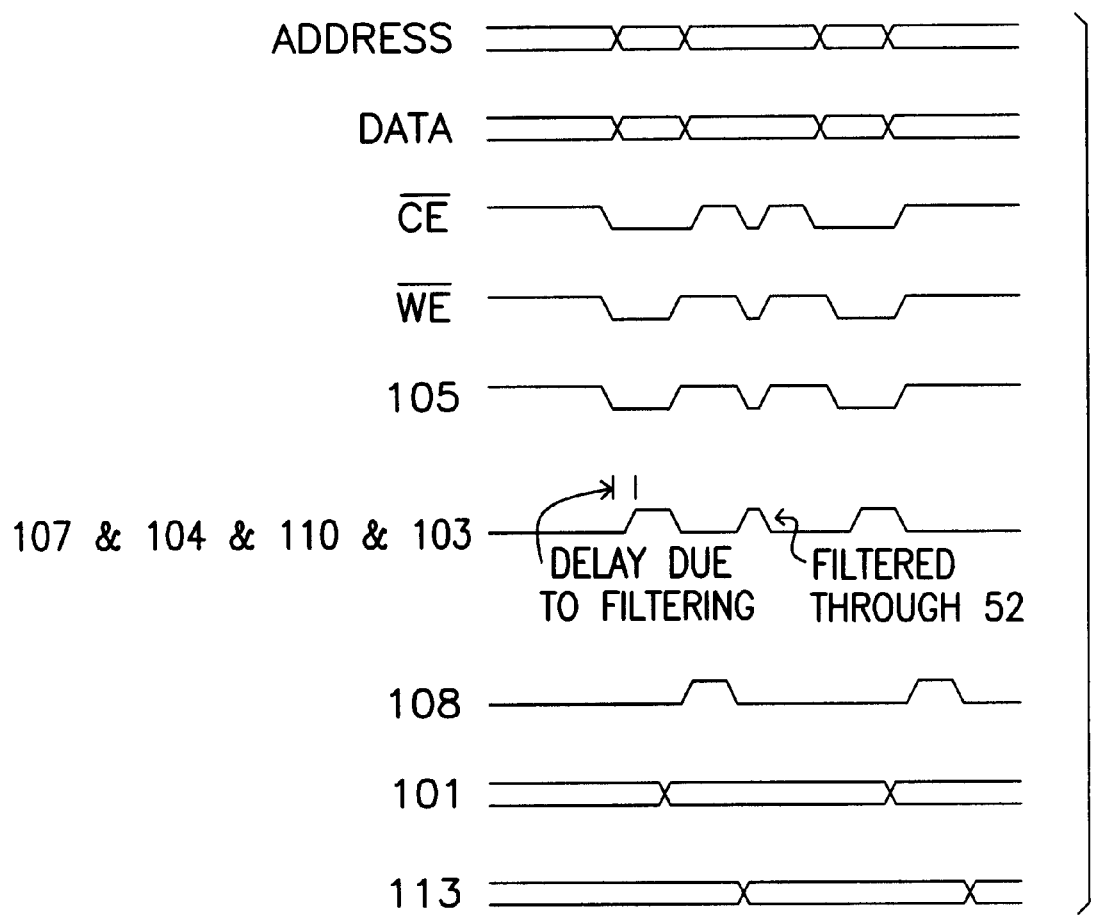
FIG. 3 is a timing diagram showing the operation of the filtered command port architecture shown in FIG. 2.

FIG. 3 is a timing diagram of a filtered command signal according to an embodiment of the present invention. When an externally provided command or data signal is filtered, the high going edge of clock signals on lines 107, 104, and 110 are delayed by the same amount as the predetermined filter duration, typically 20 ns. With further reference to FIG. 2, the clock signal on the line 107 is then typically coupled to a command clock generator 55 which in turn generates a signal on a line 103. The signal on the line 103 is coupled to command register 53, which is used to latch commands placed on a data bus 106 into command register 53. A signal on a line 102 represents the typical output of command register 53, and is normally coupled to a command decode logic circuit 54. The command decode logic circuit 54 is coupled to a state latches and logic 57 through a signal on line 101. A signal on a line 109 represents the current state of the state machine interpreting commands and executing instructions in the memory array. State latches and logic 57 will consider some legal commands as illegal if they are received out of sequence, depending on the current state that is indicated by the signal on the line 109.

FIG. 2 also depicts command decode logic 54 being coupled to command register 53 and state latches and logic 57, and generating an appropriate legal code that is represented by the signal on the line 101. Command decode logic 54 decodes the signal on the line 102, only if the current state does not prohibit the command for being out of sequence or some other reason. For example, a hexadecimal code 0×90h represents a read intelligent identifier command instruction. If this code is received during a normal read sequence, the output of command decode logic 54 is asserted to signal the control circuitry 114 via the state latches and logic circuit 57 and a line 113 to perform the necessary tasks for the command. However, if the same code is received in the middle of a program cycle, command decode logic 54 detects that the code is not valid during the program cycle operation, and the output of command decode logic 54 will not assert the signal for the operation.

A state clock generator 56 is coupled to command clock generator 55 through a signal on a line 112. On a high going edge of either CE or WE, the signal on the line 105 will typically be deasserted, and as a the clock signals on the lines 107, 104, and 110 will also typically be deasserted.

Upon the deassertion of the signal on the line 107, the signal on the line 112 is asserted and state clock generator 56 is activated. Upon activation, state clock generator 56 generates a pulse signal on a line 108 of a predetermined duration. State latches and logic 57 are coupled to state clock generator 56 through line 108. Because of the serial clocking nature of the signals on the lines 103 and 108, and the fact that by the time the signal on line 108 is asserted, the legal code represented by the signal on the line 101 is valid, state latches and logic 57 does not need to be coupled to the data bus as described in prior art inventions. Instead, the state is received off data bus 106 by command register 53. State latches and logic 57, depending upon the low going edge of the signal on the line 108, the current state, and the valid decoded command represented by the signal on the line 101 transitions to the next appropriate state. The control circuitry 114 of the chip is coupled to state latches and logic 57 through line 113. A state transition is reflected by a signal on a line 113, and the control circuitry 114 generates the necessary signals to effect the change of state.

State latches and logic 57 is also typically coupled to an address clock generator 59 and a data clock generator 58 through a line 111. Address clock generator 59 and data clock generator 58 are further normally coupled to the main clock generator circuit 52 through lines 110 and 104. Upon receiving a signal from lines 110 and 104, address clock generator 59 and data clock generator 58, depending on line 111 which signifies whether latching of address and data is necessary, send strobe timing signals to address and data latches.

In the preferred embodiments of the present invention, any pulses shorter than 20 ns are filtered. This enables the memory array to work in noisy systems. It will be recognized that other durations may be substituted for the 20 ns duration in the present system without loss of generality. In a specific memory array which embodies the present invention, the memory array operates at a cycle time of 60 ns, of which 50 ns is the amount of the time that CE or WE is typically held low. This leaves state clock generator 56 only 10 ns to latch a signal on line 108, which is typically not sufficient for reliable operation. However, the present invention of the embodiment includes the main clock generator circuit 52, which delays the output signal on line 107 by 20 ns. This 20 ns delay, when added to the existing 10 ns time period, provides a latch duration of 30 ns, which is normally sufficient for reliable operation.

Figure 1:
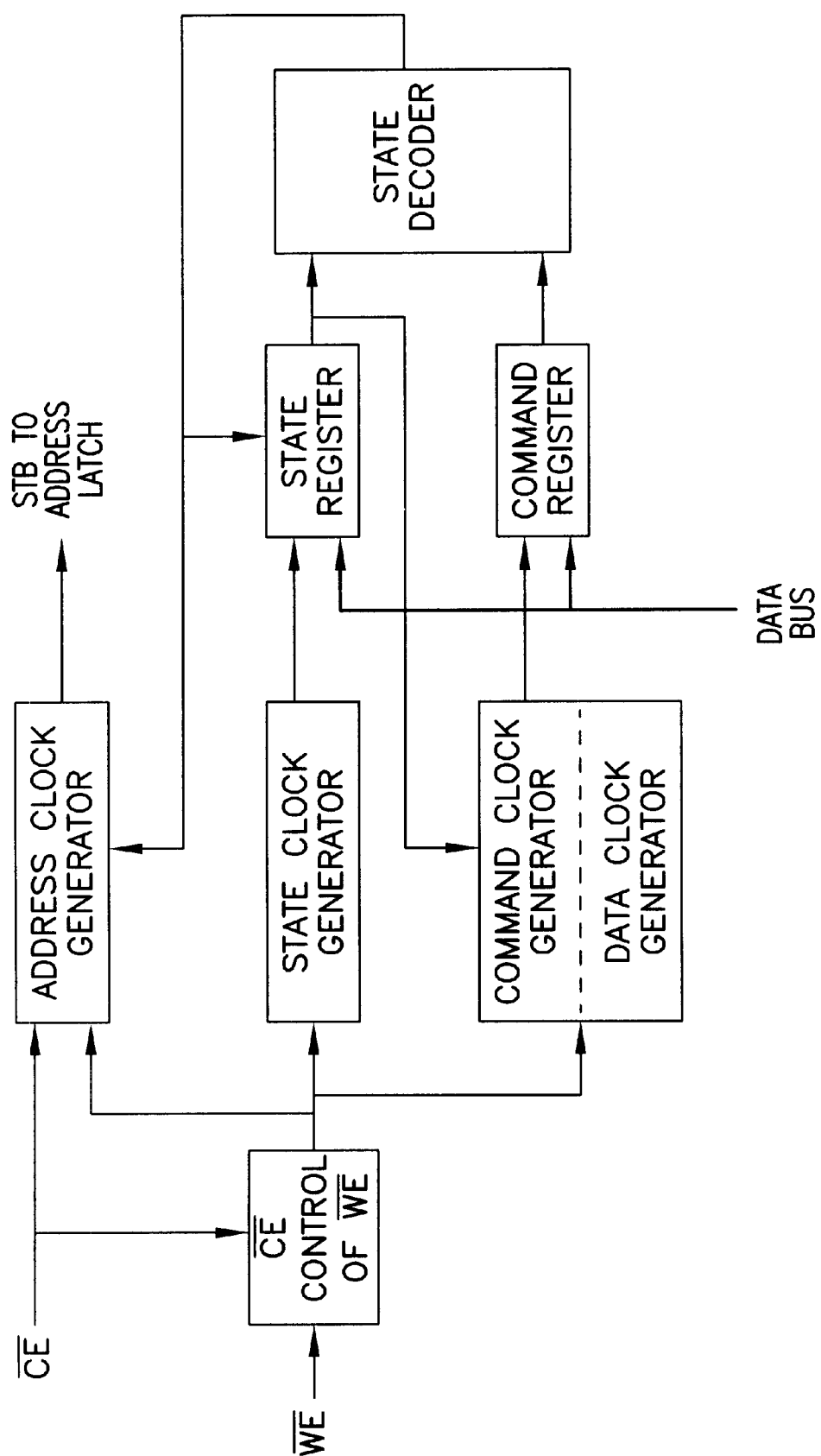
FIG. 1 is a block diagram showing a prior art command interface for flash memory.

This embodiment of the present invention is able to turn the parallel design approach of the prior art, as shown in FIG. 1, into a serial event controlled command port architecture, as shown in FIG. 2. This results directly from the incorporation of the glitch filter implemented in clock generator circuit 52. The embodiment of the present invention eliminates the need to couple the data bus directly to the state machine, and also eliminates incorrect opcodes, or commands, before they are received by state latches and logic 57. Because it is known that incorrect or invalid opcodes, or commands, are eliminated before reaching the state machine, the design of the state machine can be simplified.

Figure 4:
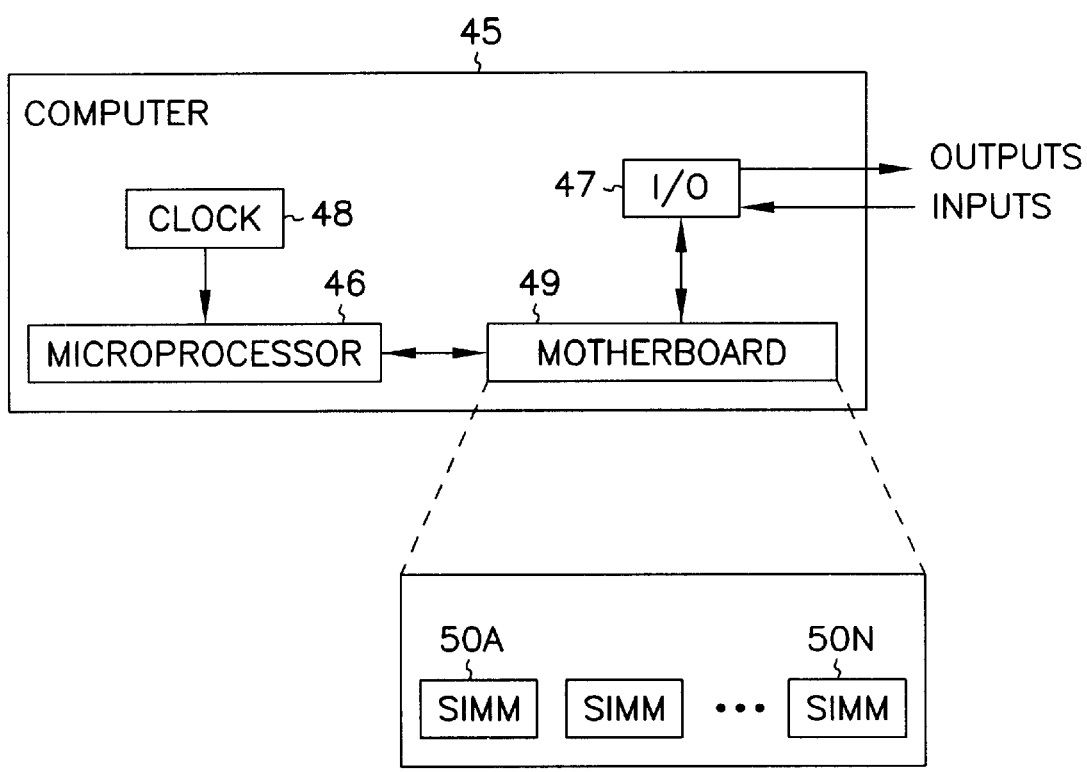
FIG. 4 is a block diagram of a computer that may incorporate the present invention.

FIG. 4 is a block diagram of an exemplary computer 45 that may incorporate the present invention. The computer 45 includes a microprocessor 46 and corresponding clock 48. The microprocessor 46 contains a central processing unit (CPU) and associated control circuitry. The microprocessor 46 is connected to a motherboard 49. An input/output (I/O) interface module 47 is connected to the motherboard 49 and interfaces the microprocessor 46 with peripheral devices such as a monitor and printer. The motherboard 49 also contains a plurality of memory modules for storing data, such as single in-line memory modules (SIMMs) 50A–50N. The motherboard 49 is typically implemented with a printed circuit board, and the SIMMs 50A–50N are typically implemented with integrated circuit chips which "plug into" the motherboard 49. A non-volatile memory is usually used on the motherboard 49 or in SIMMs 50A–50N. A non-volatile memory may also be used through the I/O interface module 47.

The foregoing description, which has been disclosed by way of the above examples and discussion, addresses preferred embodiments of the present invention encompassing the principles of the present invention. The embodiments may be changed, modified, or implemented using various circuit types and arrangements. Those skilled in the art will readily recognize that modifications and changes may be made to the present invention without strictly following the exemplary embodiments and applications illustrated and described herein, without departing from the true spirit and scope of the present invention which is set forth in the following claims.

What is claimed is:

1. A serial command port for a memory integrated circuit, comprising:
   a control input to receive a control signal having active and inactive states;
   a main clock generator responsive to a transition of the control signal to the active state to generate a main clock signal having a first leading edge transition and a first trailing edge transition, the main clock generator further operable for producing the first leading edge after a predetermined delay time period after the transition of the control signal, and the main clock generator further operable to be resistant to noise on the control input by filtering any noise pulses which are shorter than the duration of the predetermined delay time period;
   a command input to receive a memory command signal representing a memory command;
   a command latch circuit coupled to the command input and responsive to the main clock signal to latch the memory command signal;
   a state clock generator responsive to the main clock signal to generate a state clock signal having a state clock leading edge transition sequential to the first trailing edge transition of the main clock signal; and
   a state latch circuit coupled to the command latch circuit and responsive to the state clock signal to latch a legal code signal representing the memory command.

2. The serial command port of claim 1, wherein the legal code signal comprises a decoded command signal that is decoded from the memory command signal.

3. The serial command port of claim 1, further comprising a decode logic circuit coupled between the command latch circuit and the state latch circuit to decode the latched memory command signal into the legal code signal.

4. The serial command port of claim 1, wherein the command input comprises a data bus.

5. The serial command port of claim 1, wherein the main clock generator delays the first leading edge transition of the main clock signal until the control signal has remained in its active state for a predetermnined time period.

6. The serial command port of claim 5, further comprising:
   an address clock generator responsive to the first leading edge transition of the main clock signal to generate an address clock signal; and a data clock generator responsive to the first leading edge transition of the main clock signal to generate a data clock signal.

7. A system comprising:

a processor;

a memory; and a serial command port coupled between the processor and the memory, the serial command port comprising:
  a control input to receive a control signal having active and inactive states;
  a main clock generator responsive to a transition of the control signal to the active state to generate a main clock signal having a first leading edge transition and a first trailing edge transition, the main clock generator further operable for producing the first leading edge transition after a predetermined delay time after the transition of the control signal, and the main clock generator further operable to filter any noise pulses on the control input which are shorter than the predetermined delay time;
  a command input to receive a memory command signal representing a memory command;
  a command latch circuit coupled to the command input and responsive to the main clock signal to latch the memory command signal;
  a state clock generator responsive to the main clock signal to generate a state clock signal having a state clock leading edge transition sequential to the first trailing edge transition; and
  a state latch circuit coupled to the command latch circuit and responsive to the state clock signal to latch a legal code signal representing the memory command.

8. The system of claim 7, further comprising a decode logic circuit coupled between the command latch circuit and the state latch circuit to decode the latched memory command signal into the legal code signal.

9. The system of claim 7, wherein the memory comprises a memory module to store data.

10. The system of claim 7, wherein the main clock generator delays the first leading edge transition of the main clock signal until the control signal has remained in its active state for a predetermined time period.

11. The system of claim 10, wherein the first leading edge transition of the main clock signal and the state clock leading edge transition define a cycle duration independent of the predetermined time period.

12. A method comprising:

receiving a pair of external signals in a port;

asserting a main clock signal if both of the external signals are asserted for a predetermined period;

asserting a command clock signal when the main clock signal is being asserted;

latching a command from a data bus into a command register in the port in response to the command clock signal;

outputting an intermediate signal from the command register based on the command;

generating an inhibit signal indicating a state of a state latch and logic circuit in the port;

decoding the intermediate signal in a command decode logic circuit in the port and generating a code based on the intermediate signal when the inhibit signal does not prohibit the command;

inputting the code to the state latch and logic circuit;

deasserting the main clock signal if either of the external signals is deasserted;

asserting a state clock activation signal when the main clock signal is deasserted to activate a state clock generator in the port;

outputting a pulse from the state clock generator when the state clock activation signal is asserted;

inputting the pulse to the state latch and logic circuit; and changing the state of the state latch and logic circuit according to the code in response to the pulse.

13. The method of claim 12 wherein:

receiving the pair of external signals further comprises receiving write enable and chip enable signals in the port; and asserting the main clock signal further comprises asserting the main clock signal if both the write enable and chip enable signals are asserted for 20 nanoseconds.

14. The method of claim 12, further comprising:

asserting a filterable signal if both of the external signals are asserted; and wherein asserting the main clock signal further comprises asserting the main clock signal after the filterable signal has been asserted for a predetermined period.

15. The method of claim 12, further comprising controlling a memory based on the state of the state latch and logic circuit and the command latched in the command register.

16. The method of claim 12, further comprising sending strobe signals to an address latch when the main clock signal is being asserted.

17. A method comprising:

receiving at least one external signal in a port of a device;

latching a command from a data bus into a command register in the port if the at least one external signal is asserted for a minimum predetermined time period;

filtering noise from the at least one external signal to remove any noise which is shorter in duration than the minimum predetermined time period;

changing a state of a state latch and logic circuit in the port according to the command after a delay time period equal to the minimum predetermined time period when the at least one external signal is deasserted.

18. The method of claim 17, wherein latching the command further comprises:

asserting a main clock signal after the delay time period if the at least one external signal is asserted for the minimum predetermined time period;

asserting a command clock signal when the main clock signal is being asserted; and latching the command from the data bus into the command register in the port in response to the command clock signal.

19. The method of claim 17 wherein:

receiving the at least one external signal further comprises receiving at least one of a write enable and chip enable signal in the port of the device; and latching the command further comprises latching the command from the data bus into the command register in the port if the at least one of the write enable and chip enable signal is asserted for 20 nanoseconds.

20. The method of claim 17, further comprising controlling the device according to the state of the state latch and logic circuit and the command latched in the command register.

21. The method of claim 17, further comprising sending strobe signals to a data latch if the at least one external signal is asserted for the predetermined period.

22. A method comprising:

receiving a pair of external signals in a port of a device;

latching a command from a data bus into a command register in the port if both of the external signals are asserted for a predetermined period;

changing a state of a state latch and logic circuit in the port according to the command when either of the external signals is deasserted;

wherein latching the command further comprises:
asserting a main clock signal if both of the external signals are asserted for a predetermined period;
asserting a command clock signal when the main clock signal is being asserted;
latching the command from the data bus into the command register in the port in response to the command clock signal; and wherein changing the state of the state latch and logic circuit comprises:

outputting an intermediate signal from the command register based on the command;

generating an inhibit signal indicating a state of the state latch and logic circuit in the port;

decoding the intermediate signal in a command decode logic circuit in the port and generating a code based on the intermediate signal when the inhibit signal does not prohibit the command;

inputting the code to the state latch and logic circuit;

deasserting the main clock signal if either of the external signals is deasserted;

asserting a state clock activation signal when the main clock signal is deasserted to activate a state clock generator in the port;

outputting a pulse from the state clock generator when the state clock activation signal is asserted;

inputting the pulse to the state latch and logic circuit; and changing the state of the state latch and logic circuit to a state according to the code in response to the pulse.

23. A port coupled between two devices comprising:

a main clock generator circuit responsive to at least one external signal to assert a main clock signal when the at least one external signal has been asserted for a predetermined period and to deassert the main clock signal when the at least one external signal is deasserted;

a command clock generator coupled to the main clock generator circuit to assert a command clock signal when the main clock signal is asserted and to assert a state clock activation signal when the main clock signal is deasserted;

a command register coupled to the command clock generator to latch a command from a data bus in response to the command clock signal and to generate an intermediate signal based on the command;

a command decode logic circuit coupled to the command register to decode the intermediate signal and to output a code based on the intermediate signal;

a state latch and logic circuit coupled to the command decode logic circuit to receive the code and to output an inhibit signal, indicating a state of the state latch and logic circuit, to the command decode logic circuit, the command decode logic circuit being prevented from decoding the intermediate signal by the inhibit signal if the code is considered illegal by the state of the state latch and logic circuit; and a state clock generator coupled between the command clock generator and the state latch and logic circuit to receive the state clock activation signal and to output a pulse to the state latch and logic circuit when the state clock activation signal is asserted, the state of the state latch and logic circuit being changed according to the code from the command decode logic circuit in response to the pulse from the state clock generator.

24. The port of claim 23 wherein the main clock generator circuit is coupled to receive the at least one external signal is at least one of a write enable and chip enable signals to assert the main clock signal when at least one of the write enable and chip enable signals have been asserted for 20 nanoseconds.

25. The port of claim 23 wherein the main clock generator circuit is further operable to filter a noise signal from the at least one external signal the main clock generator circuit is further operable to assert the main clock signal if the noise signal has been asserted for less than the predetermined period.

26. The port of claim 23, further comprising:

an address clock generator coupled to the main clock generator circuit to output a first strobe signal in response to the main clock signal; and a data clock generator coupled to the main clock generator circuit to output a second strobe signal in response to the main clock signal.

27. A port coupled between two devices comprising:

clock generation circuitry coupled to receive at least one external signal the clock generation circuitry operable for filtering noise pulses from the at least one external signal when the duration of the noise pulse is less than a delay period;

a command register coupled to the clock generation circuitry to latch a command from a data bus when the at least one external signal has been asserted for a predetermined period which is greater than the delay period; and a state latch and logic circuit coupled to the command register and the clock generation circuitry, a state of the state latch and logic circuit being changed according to the command after the at least one external signal is deasserted.

28. The port of claim 27 wherein the clock generation circuitry comprises:

a main clock generator circuit coupled to receive the at least one external signal to assert a main clock signal after the delay period when the at least one external signal has been asserted for the predetermined period and to deassert the main clock signal when the at least one external is deasserted; and a command clock generator coupled to the main clock generator circuit to assert a command clock signal when the main clock signal is asserted and to assert a state clock activation signal when the main clock signal is deasserted.

29. The port of claim 28 wherein the main clock generator circuit is coupled to receive at least one of a write enable and chip enable signals as the at least one external signal, to assert the main clock signal when the at least one write enable and chip enable signal has been asserted for 20 nanoseconds and to deassert the main clock signal when either the write enable or the chip enable signal is deasserted.

30. The port of claim 28 wherein the main clock generator circuit is further operable to filter a noise signal from the at least one external signal the main clock generator circuit is further operable to assert the main clock signal if the noise signal has been asserted for less than the predetermined period.

31. The port of claim 28, further comprising:
an address clock generator coupled to the main clock generator circuit to output a first strobe signal in response to the main clock signal; and
a data clock generator coupled to the main clock generator circuit to output a second strobe signal in response to the main clock signal.

32. The port of claim 28 wherein:
the command register is coupled to the command clock generator to latch the command from the data bus in response to the command clock signal and to generate an intermediate signal based on the command; and
a command decode logic circuit is coupled to the command register to decode the intermediate signal and to generate a code based on the intermediate signal.

33. The port of claim 32 wherein:
the state latch and logic circuit is coupled to the command decode logic circuit to receive the code and to output an inhibit signal, indicating a state of the state latch and logic circuit, to the command decode logic circuit, the command decode logic circuit being prevented from decoding the intermediate signal by the inhibit signal if the code is considered illegal by the state of the state latch and logic circuit; and
further comprising a state clock generator coupled between the command clock generator and the state latch and logic circuit to receive the state clock activation signal and to output a pulse to the state latch and logic circuit when the state clock activation signal is asserted, the state of the state latch and logic circuit being changed according to the code from the command decode logic circuit in response to the pulse from the state clock generator in less than or equal to 30 nanoseconds.

34. A method comprising:
receiving an external signal in a port of a device;
asserting a main clock signal after a delay time period if the external signal is asserted for a predetermined period which is greater than the delay time period;
filtering noise from the external signal if the noise pulse width is less than the delay time period;
asserting a command clock signal when the main clock signal is being asserted;
latching a command from a data bus into a command register in the port in response to the command clock signal; and
changing a state of a state latch and logic circuit in the port according to the command after the delay time period when the external signal is deasserted.

35. The method of claim 34 wherein:
receiving the external signal further comprises receiving at least one of a write enable and chip enable signal in the port of the device; and
latching the command further comprises latching the command from the data bus into the command register in the port after the delay time period if at least one of the write enable and chip enable signal is asserted for 20 nanoseconds; and
further comprising:
controlling the device according to the state of the state latch and logic circuit and the command latched in the command register; and sending a strobe signals to an address latch if both of the external signals are asserted for the predetermined period.

36. A method comprising:
receiving a pair of external signals in a port of a device;
asserting a main clock signal if both of the external signals are asserted for a predetermined period;
asserting a command clock signal when the main clock signal is being asserted;
latching a command from a data bus into a command register in the port in response to the command clock signal;
changing a state of a state latch and logic circuit in the port according to the command when either of the external signals is deasserted; and
wherein changing the state of the state latch and logic circuit comprises:
outputting an intermediate signal from the command register based on the command;
generating an inhibit signal indicating a state of the state latch and logic circuit in the port;
decoding the intermediate signal in a command decode logic circuit in the port and generating a code based on the intermediate signal when the inhibit signal does not prohibit the command;
inputting the code to the state latch and logic circuit;
deasserting the main clock signal if either of the external signals is deasserted;
asserting a state clock activation signal when the main clock signal is deasserted to activate a state clock generator in the port;
outputting a pulse from the state clock generator when the state clock activation signal is asserted;
inputting the pulse to the state latch and logic circuit; and
changing the state of the state latch and logic circuit to a state according to the code in response to the pulse.

37. A port coupled between two devices comprising:
a main clock generator circuit responsive to at least one external enable signal to assert a main clock signal after a delay period when the at least one external enable signal has been asserted for a predetermined period and to deassert the main clock signal when the at least one external enable signal is deasserted and to filter any noise signals on the at least one external enable signal which are narrower than the delay period;
a command clock generator coupled to the main clock generator circuit to assert a command clock signal when the main clock signal is asserted and to assert a state clock activation signal when the main clock signal is deasserted;
a command register coupled to the command clock generator to latch a command from a data bus in response to the command clock signal; and
a state latch and logic circuit coupled to the command register and the command clock generator, a state of the state latch and logic circuit being changed to a state according to the command in response to the state clock activation signal.

38. The port of claim 37 wherein:
the main clock generator circuit is coupled to receive at least one of a write enable and chip enable signals as the at least one external enable signal, to assert the main clock signal when the at least one external enable signal of the write enable and chip enable signals have been asserted for at least 20 nanoseconds and to deassert the main clock signal when either of the at least one external enable signal of the write enable or the chip enable signals is deasserted;

the main clock generator circuit is further operable to filter a noise signal from the at least one external enable signal, the main clock generator circuit being further operable to assert the main clock signal if the noise signal has been asserted for less than 20 nanoseconds;

the command register further operates to generate an intermediate signal based on the command;

a command decode logic circuit is coupled to the command register to decode the intermediate signal and to generate a code based on the intermediate signal;

the state latch and logic circuit is coupled to the command decode logic circuit to receive the code and to generate an inhibit signal indicating a state of the state latch and logic circuit that is coupled to the command decode logic circuit, the command decode logic circuit being prevented from decoding the intermediate signal by the inhibit signal if the code is considered illegal by the state of the state latch and logic circuit; and further comprising:

a state clock generator coupled between the command clock generator and the state latch and logic circuit to receive the state clock activation signal and to couple a pulse to the state latch and logic circuit when the state clock activation signal is asserted, the state of the state latch and logic circuit being changed according to the code in response to the pulse;

an address clock generator coupled to the main clock generator circuit to generate a strobe signal in response to the main clock signal; and a data clock generator coupled to the main clock generator circuit to generate a strobe signal in response to the main clock signal.

39. A port coupled between two devices comprising:

clock generation circuitry coupled to receive an external signal;

means for storing a command from a data bus after a predetermined delay time after the external signal has been asserted for a predetermined period which is greater than the predetermined delay time; and a state latch and logic circuit coupled to the means for storing and the clock generation circuitry, a state of the state latch and logic circuit being changed to a state according to the command after the external signal is deasserted.

* * * * *

UNITED STATES PATENT AND TRADEMARK OFFICE
CERTIFICATE OF CORRECTION

PATENT NO. : 6,578,124 B1
DATED : June 10, 2003
INVENTOR(S) : Frankie F. Roohparvar It is certified that error appears in the above-identified patent and that said Letters Patent is hereby corrected as shown below:

Title page,
Item [56], References Cited, U.S. PATENT DOCUMENTS, delete "711/103" and insert -- 364/900 -- therefor.

Column 2,
Line 16, insert -- sent -- after "separately".

Column 3,
Lines 61 and 62, delete "WE" and insert --$\overline{WE}$-- therefor.

Lines 61 and 62, delete "CE" and insert --$\overline{CE}$-- therefor.

Column 4,
Line 2, insert -- from continuing, and none of the outputs of main clock generator circuit 52 are asserted. -- after "prevented".

Line 12, delete "WE" and insert --$\overline{WE}$-- therefor.

Line 13, delete "CE" and insert --$\overline{CE}$-- therefor.
Line 22, delete "from continuing, and none of the outputs of main clock generator circuit 52 are asserted" after "52".
Line 30, delete ", typically" and insert -- of -- therefor.
Line 31, delete "typically" after "then".
Line 36, delete "typical" before "output".
Line 37, delete "normally" before "coupled".
Line 40, delete "109" and insert -- 101 -- therefore
Line 65, delete "CE" and insert --$\overline{CE}$-- therefor.

Line 65, delete "WE" and insert --$\overline{WE}$-- therefor.

Line 66, insert -- result, -- after "as a".
Line 67, delete "typically" before "be".

UNITED STATES PATENT AND TRADEMARK OFFICE
CERTIFICATE OF CORRECTION

PATENT NO. : 6,578,124 B1
DATED : June 10, 2003
INVENTOR(S) : Frankie F. Roohparvar It is certified that error appears in the above-identified patent and that said Letters Patent is hereby corrected as shown below:

<u>Column 5,</u>
Line 11, delete "as described in prior art inventions" after "bus".
Line 21, delete "typically" after "also".
Line 24, delete "normally" before "coupled".

Line 38, delete "CE" and insert $--\overline{CE}--$ therefor.

Line 38, delete "WE" and insert $--\overline{WE}--$ therefor.

Line 42, delete "invention of the embodiment" and insert -- embodiment of the invention -- therefor.
Line 46, delete "normally" before "sufficient".

<u>Column 6,</u>
Lines 4 and 5, delete "typically" before "implemented".

Signed and Sealed this

Twentieth Day of January, 2004

JON W. DUDAS
*Acting Director of the United States Patent and Trademark Office*